US008125028B2

(12) United States Patent
Tsai et al.

(10) Patent No.: US 8,125,028 B2
(45) Date of Patent: Feb. 28, 2012

(54) SEMICONDUCTOR DEVICES FOR HIGH POWER APPLICATION

(75) Inventors: Hung-Shern Tsai, Tainan County (TW); Geeng-Lih Lin, Hsinchu Hsien (TW); Wen-Jya Liang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 706 days.

(21) Appl. No.: 12/265,580

(22) Filed: Nov. 5, 2008

(65) Prior Publication Data

US 2009/0261409 A1  Oct. 22, 2009

(30) Foreign Application Priority Data

Apr. 21, 2008  (TW) .............................. 97114479 A

(51) Int. Cl.
  *H01L 29/66* (2006.01)
(52) U.S. Cl. .................. 257/339; 257/E29.261
(58) Field of Classification Search .................. 257/339, 257/E29.261
See application file for complete search history.

(56) References Cited

U.S. PATENT DOCUMENTS

| 6,194,761 | B1 | 2/2001 | Chiozzi et al. | |
| 6,531,355 | B2 | 3/2003 | Mosher et al. | |
| 2001/0053581 | A1* | 12/2001 | Mosher et al. | 438/297 |
| 2003/0038316 | A1* | 2/2003 | Tsuchiko et al. | 257/324 |

* cited by examiner

*Primary Examiner* — Zandra Smith
*Assistant Examiner* — Marvin Payen

(57) ABSTRACT

Semiconductor devices for high voltage application are presented. A high power semiconductor device includes a first type doped semiconductor substrate and a second type doped epitaxial layer deposited thereon. A first type doped body region is disposed in the second type doped epitaxial layer. A heavily doped drain region is formed in the second type doped epitaxial layer and isolated from the first type doped body region with an isolation region and a channel. A second type deep heavily doped region extends from the heavily doped drain region to the semiconductor substrate. A pair of inversed type heavily doped source regions is disposed in the first type doped body region. A gate electrode is disposed overlying the channel with a dielectric layer interposed therebetween. The high power semiconductor device is isolated from the other semiconductor devices with a first type deep heavily doped region.

7 Claims, 6 Drawing Sheets

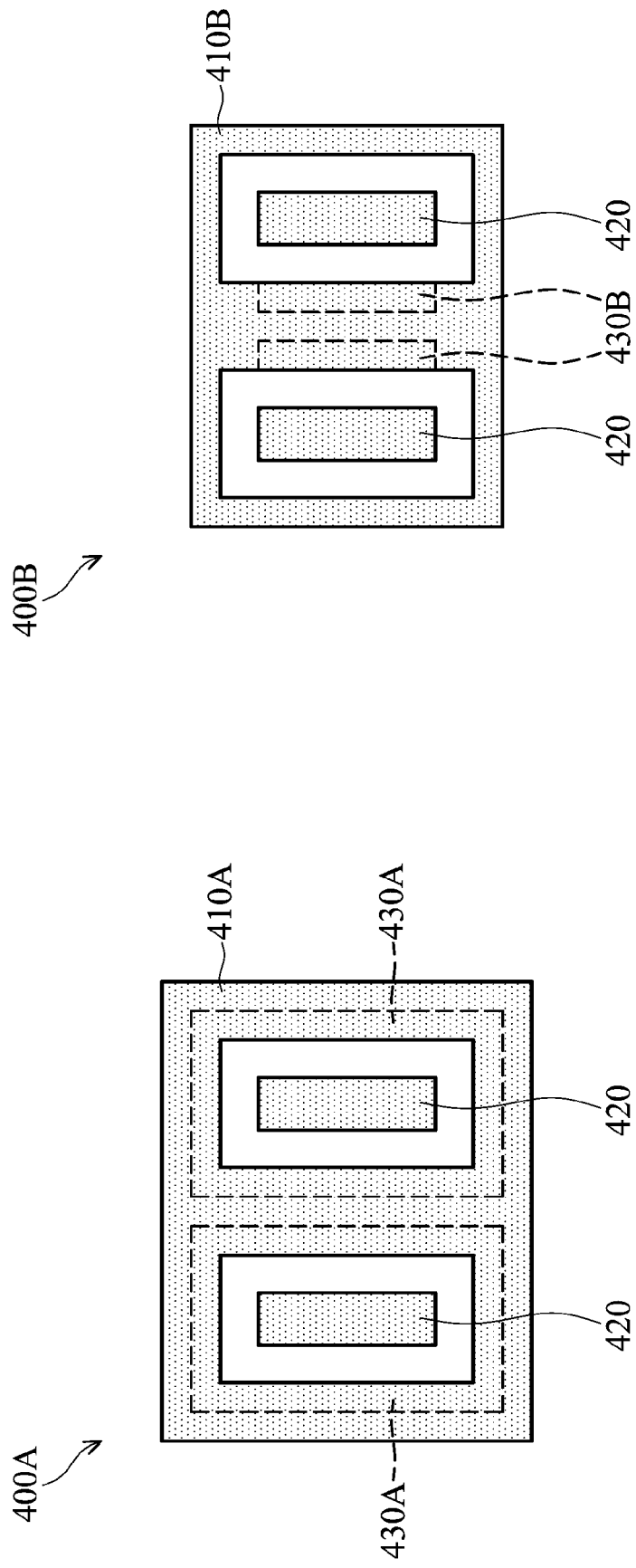

SEMICONDUCTOR DEVICES FOR HIGH POWER APPLICATION

CROSS REFERENCE TO RELATED APPLICATIONS

This Application claims priority of Taiwan Patent Application No. 097114479, filed on Apr. 21, 2008, the entirety of which is incorporated by reference herein.

BACKGROUND OF THE INVENTION

1. Field of the Invention

The present invention relates to a semiconductor device, and in particular relates to a PIN diode device and the method for forming thereof.

2. Description of the Related Art

High power semiconductor devices are applied to integrated circuits with high voltage and high power. Traditional high power semiconductor devices are mainly used for devices with at least 18 volts or higher. The advantages of high power device technology include cost effectiveness and process compatibility. High power device technology has been widely used in display driver IC devices, power supply devices, power management fields, communications fields, autotronics fields, and industrial control fields, etc.

Traditional high power devices are provided with vertical double diffused MOSFETs (VDMOSFETs) and lateral double diffused MOSFETs (LDMOSFETs), wherein a double diffused MOSFET is a representative lateral structure and a trench power transistor is a representative vertical structure.

U.S. Pat. No. 6,194,761 discloses an N-type channel vertical double diffused MOSFET, wherein a vertical current is controlled by a junction field effect transistor effect resulting from the boundary of depletion regions of two P-type doped body regions and an epitaxial layer expending to a central region.

FIG. 1 shows a cross-sectional view of a traditional pseudo-VDMOS transistor device. As FIG. 1 shown, the high power pseudo-VDMOS transistor device comprises a P-type doped semiconductor substrate 11 and an N-type doped epitaxial layer 13 formed on the P-type doped semiconductor substrate 11. An N-type heavily doped buried region 23 is deposited between the P-type doped semiconductor substrate 11 and N-type doped epitaxial layer 13. Two P-type doped body regions 31, 37 are formed in the N-type doped epitaxial layer 13, respectively, and isolated from each other with a channel. A heavily doped drain region 21 is formed in the N-type doped epitaxial layer and isolated from the P-type doped body region 37 with an isolation region 15. An N-type deep heavily doped region 25 is extended from the heavily doped drain region 21 to the N-type heavily doped buried region 23. A pair of inversed type heavily doped source regions 33A, 33B are formed in the P-type doped body regions 31, 37, respectively, and a gate electrode 39 is disposed overlying the channel with a gate dielectric interposed therebetween. The high power semiconductor device is isolated from the other devices with a pair of P-type heavily doped regions 17 and a pair of P-type deep heavily doped regions 19. During operation of the device, the heavily doped drain region 21 is coupled to a drain voltage (VDD), and the heavily doped source regions 33A, 33B and gate electrode 39 are coupled to a source voltage (VSS). The current path is represented by a boldfaced dotted line. The advantage of the pseudo-VDMOS transistor power device 10 is its high compatibility with other CMOS devices. However, the device region isolated by the P-type deep heavily doped regions 19 occupies too much area, which makes device integration difficult.

U.S. Pat. No. 6,531,355 discloses a lateral double diffused MOS (LDMOS) transistor device. The operating principle of a traditional LDMOSFET is the same as any other MOSFET. All MOSFET's control current flowing between the drain and the source by a channel resulting from the gate voltage.

FIG. 2 shows a cross-sectional view of a traditional LDMOS transistor device. As FIG. 2 shown, a high power LDMOS transistor device 50 comprises a P-type doped semiconductor substrate 51 and an N-type doped epitaxial layer 53 formed on the P-type doped semiconductor substrate 51. A P-type doped body region 67 is formed in the N-type doped epitaxial layer 53. An N-type deep heavily doped region 65 is formed in the N-type doped epitaxial layer 53. An N-type heavily doped drain region 61 is formed in the N-type deep heavily doped region 65 and isolated from the P-type doped body region 67 with an isolation region 55 and a channel. A pair of inversed type heavily doped source regions 63A, 63B are formed in the P-type doped body region 67 and a gate electrode 69 is disposed overlying the channel with a gate dielectric interposed therebetween. The high power semiconductor device is isolated from the other devices with a pair of P-type heavily doped regions 57 and a pair of P-type deep heavily doped regions 59. During operation of the device, the heavily doped drain region 61 is coupled to a drain voltage ($V_{DD}$), the heavily doped source regions 63A, 63B are coupled to a source voltage ($V_{SS}$), and gate electrode 69 is coupled to gate voltage ($V_G$). The current path is represented by a boldfaced dotted line. The advantageous of the LDMOS transistor power device 50 include ease of production and high compatibility with CMOS semiconductor technology processes. However, LDMOSFET's raise voltage tolerances by increasing the length of the drift region near the drain, which in turn consumes a lot of area. Moreover, surface field of a double diffused transistor also limits the voltage tolerance of transistor.

Therefore, a high power semiconductor power device with the high voltage tolerance feature of VDMOS and LDMOS transistor devices and smaller volume is needed.

BRIEF SUMMARY OF THE INVENTION

In order to overcome the disadvantageous mentioned above, the invention provides a high voltage (high power) semiconductor device which maintains voltage tolerance and reducing the distance between the devices to expand the process window and raise manufacturing yields.

The invention provides a high power semiconductor device, comprising: a first type doped semiconductor substrate; a second type doped epitaxial layer deposited on the first type doped semiconductor substrate; a first type doped body region disposed in the second type doped epitaxial layer; a heavily doped drain region formed in the second type doped epitaxial layer and isolated from the first type doped body region with an isolation region and a channel; a second type deep heavily doped region extending from the heavily doped drain region to the first type doped semiconductor substrate; a pair of inversed type heavily doped source regions disposed in the first type doped body region; and a gate electrode disposed overlying the channel with a dielectric interposed therebetween, wherein the high power semiconductor device is isolated from the other devices with a first type heavily doped region.

The invention also provides a high power semiconductor device, comprising: a P-type doped semiconductor substrate;

an N-type doped epitaxial layer deposited on the P-type doped semiconductor substrate; an N-type heavily doped buried region deposited between the P-type doped semiconductor substrate and the N-type doped epitaxial layer; a P-type doped body region disposed in the N-type doped epitaxial layer; a heavily doped drain region formed in the N-type doped epitaxial layer and isolated from the P-type doped body region with an isolation region and a channel; an N-type deep heavily doped region extending from the heavily doped drain region to the P-type doped semiconductor substrate; a pair of inversed type heavily doped source regions disposed in the P-type doped body region; and a gate electrode disposed overlying the channel with a dielectric interposed therebetween, wherein the high power semiconductor device is isolated from the other devices with a pair of P-type heavily doped regions.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 5B and 5C show the top views of LDMOS-FET devices of embodiments of the invention.

DETAILED DESCRIPTION OF THE INVENTION

Figure 1:
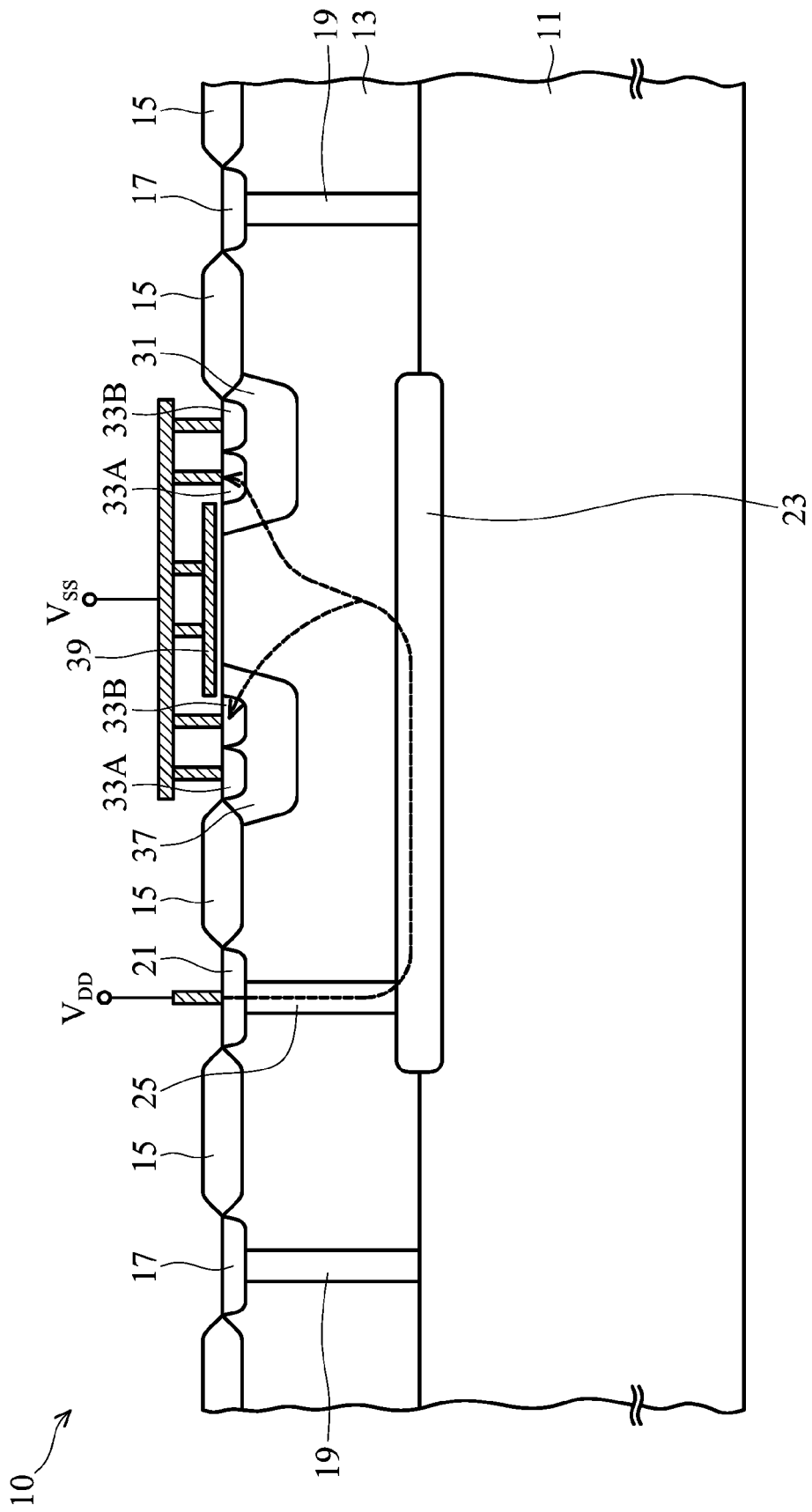
FIG. 1 shows a cross-sectional view of a traditional pseudo-VDMOS transistor device.
Figure 2:
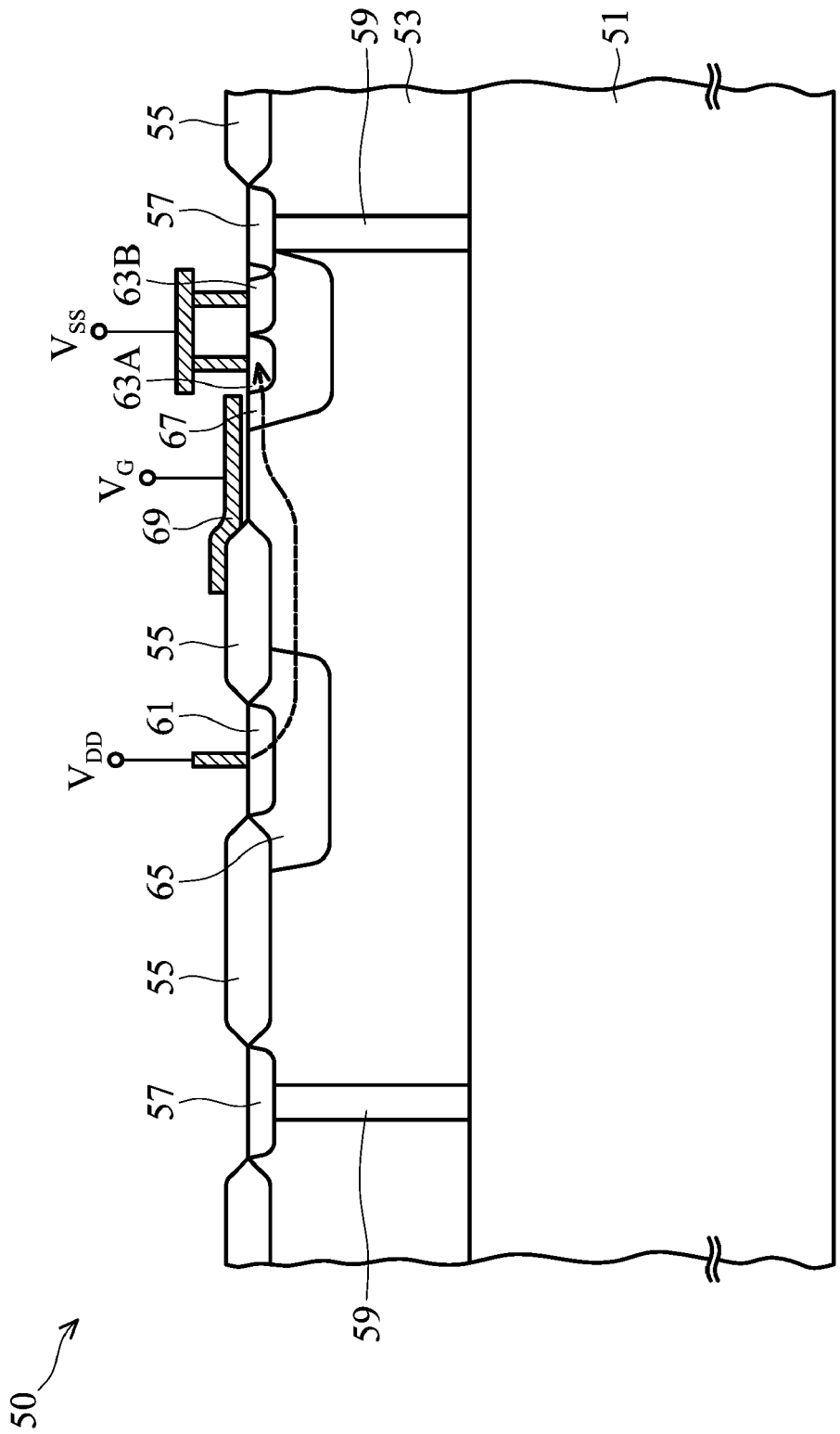
FIG. 2 shows a cross-sectional view of a traditional LDMOS transistor device.

The following description is of the best-contemplated mode of carrying out the invention. This description is made for the purpose of illustrating the general principles of the invention and should not be taken in a limiting sense. The scope of the invention is best determined by reference to the appended claims.

Reference will be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, these are merely examples and are not intended to be limiting.

The embodiment of the invention provides a high power semiconductor device, which has the advantageous of vertical and lateral double diffused transistors. The high power semiconductor device uses the two dimensional and three dimensional principles of reduced surface field (RESURF) to increase the breakdown voltage to raise the voltage tolerance of the transistor. Thus, with the two dimensional and three dimensional RESURF structures, the high power semiconductor device has improved surface field.

Figure 3:
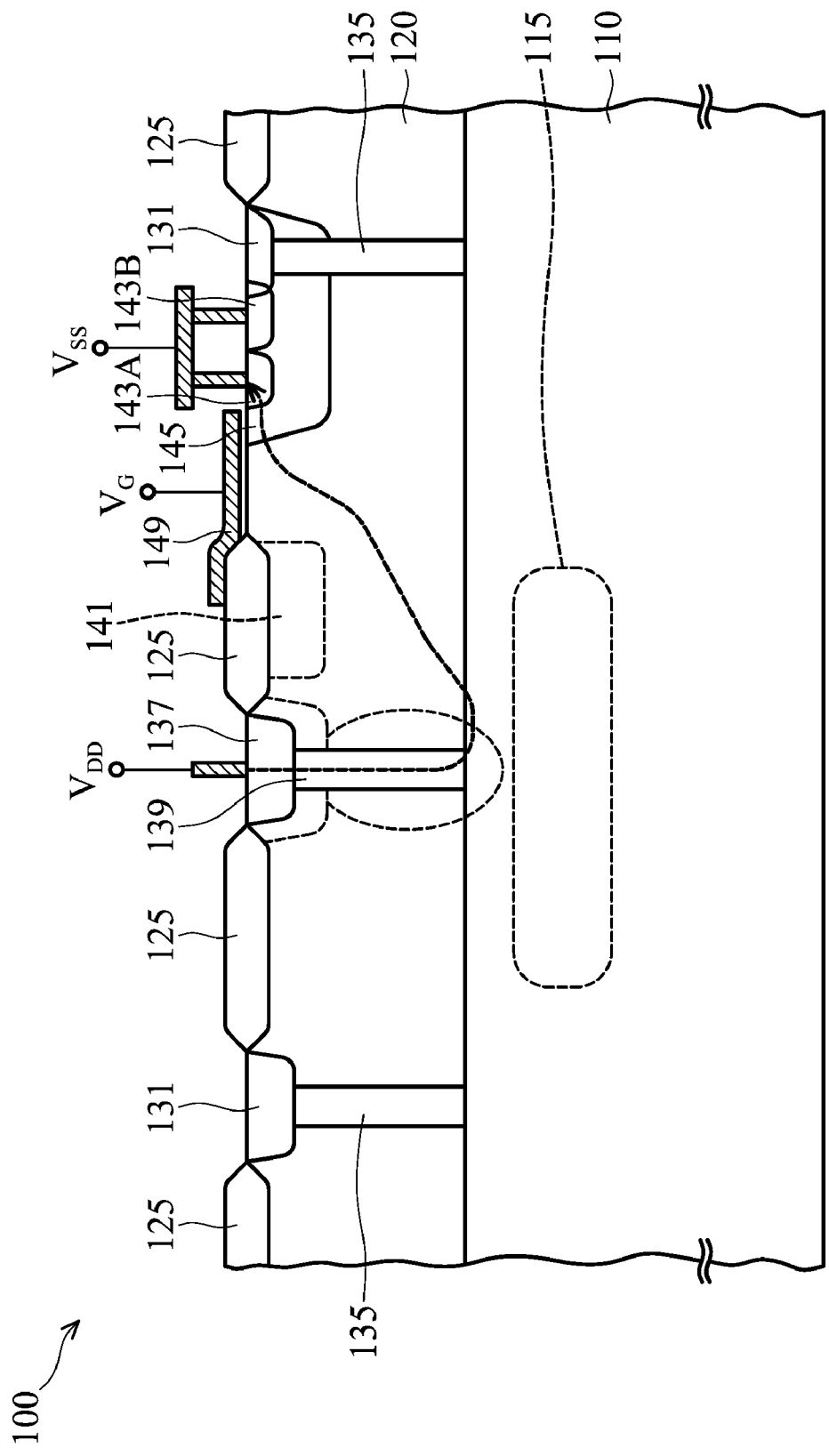
FIG. 3 shows a cross-sectional view of an LDMOS-FET device of one embodiment of the invention.

FIG. 3 shows a cross-sectional view of an LDMOS-FET device of one embodiment of the invention. As FIG. 3 shows, a high power LDMOS-FET device 100 comprises a first type doped semiconductor substrate 110, such as a P-type single crystal silicon bulk substrate or silicon on insulator (S01). A second type doped epitaxial layer (such as an N-type epitaxial layer) 120 is formed on the first type doped semiconductor substrate 110. A first type doped body region 145 is disposed in the second type doped epitaxial layer 110. A heavily doped drain region 137 is formed in the second type doped epitaxial layer 120 and isolated from the first type doped body region 145 with an isolation region 125 and a channel. A second type deep heavily doped region 139 extends from the heavily doped drain region 137 to the first type doped semiconductor substrate 110. Because the second type deep heavily doped region 139 is formed between the heavily doped drain region 137 and the first type doped semiconductor substrate 110, the LDMOS-FET device may tolerate higher voltages. A pair of inversed type heavily doped source regions (such as the N-type heavily doped region 143A and the P-type heavily doped region 143B) is disposed in the first type doped body region 145. A gate electrode 149 is disposed overlying the channel with a dielectric interposed therebetween. The LDMOS-FET device is isolated from the other devices with a first type heavily doped region 131 and a first type deep heavily doped region 135. The first type deep heavily doped region 135 extends from the first type heavily doped region 131 to the first type doped semiconductor substrate.

According to one embodiment of the invention, the high power LDMOS-FET device 100 may further comprise a first floating first type doped region 141 disposed beneath the isolation region 125 and between the channel and the heavily doped drain region 137. The first floating first type doped region 141 is used for obstructing surface transverse current, and two dimensionally reducing the surface field. That is, the surface field is reduced by using a two dimensional RESURF structure.

Furthermore, high power LDMOS-FET device 100 may further comprise a second floating first type doped region 115 disposed in the first type doped semiconductor substrate and beneath the heavily doped drain region. The second floating first type doped region 115 is used for three dimensionally reducing the surface field. That is, the surface field is reduced by using a three dimensional RESURF structure.

During operation of the device, the heavily doped drain region 137 is coupled to a drain voltage ($V_{DD}$), the heavily doped source regions 143A, 143B are coupled to a source voltage ($V_{SS}$), and gate electrode 149 is coupled to gate voltage ($V_G$). The current path is represented by a boldfaced dotted line. It is noted that the voltage $V_G$ applied at the gate electrode is the same as the voltage $V_{DD}$ applied at the drain. Or, optionally, the voltage $V_G$ applied at the gate electrode is different from the voltage $V_{DD}$ applied at the drain.

Figure 4:
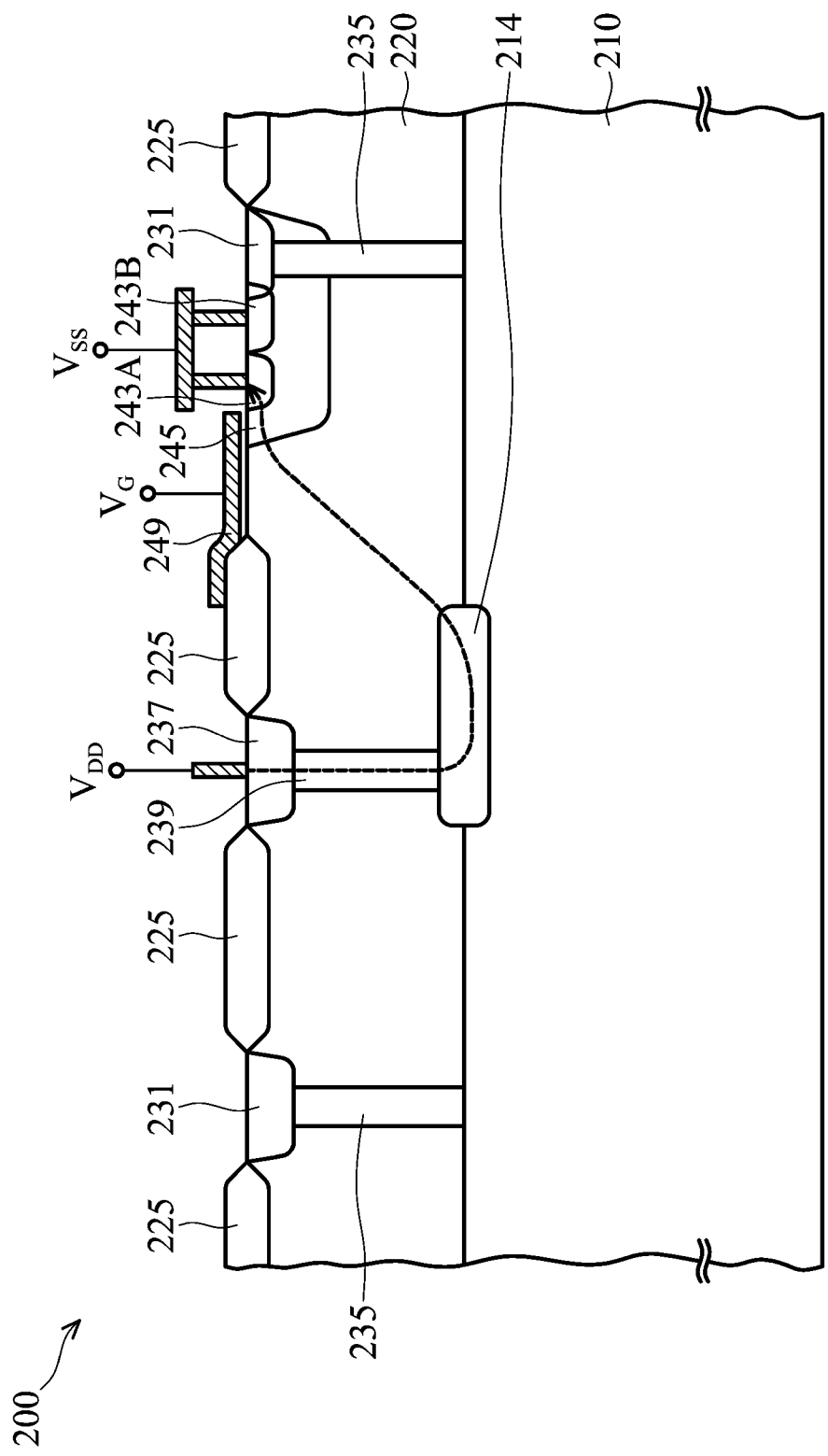
FIG. 4 shows a cross-sectional view of an LDMOS-FET device of another embodiment of the invention.

FIG. 4 shows a cross-sectional view of an LDMOS-FET device of another embodiment of the invention. As FIG. 4 shows, a high power LDMOS-FET device 200, comprises a P-type doped semiconductor substrate 210 and an N-type doped epitaxial layer 220 deposited on the P-type doped semiconductor substrate 210. An N-type heavily doped buried region 214 is deposited between the P-type doped semiconductor substrate and the N-type doped epitaxial layer. By depositing the N-type heavily doped buried region 214, the resistance between the drain and the source ($R_{sdon}$), and breakdown voltage of the device may be optimized.

A P-type doped body region 245 is disposed in the N-type doped epitaxial layer 220. A heavily doped drain region is formed in the N-type doped epitaxial layer 220 and isolated from the P-type doped body region 245 with an isolation region 225 and a channel. An N-type deep heavily doped region 239 extends from the heavily doped drain region 237 to the N-type heavily doped buried region 214. A pair of inversed type heavily doped source regions (such as N-type heavily doped region 243A and P-type heavily doped region 243B) is disposed in the P-type doped body region 245. A gate electrode 249 is disposed overlying the channel with a dielectric interposed therebetween. The LDMOS-FET device is isolated from the other devices with a P-type heavily doped region 231 and a P-type deep heavily doped region 235. The P-type deep heavily doped region 235 extends from the P-type heavily doped region 231 to the P-type doped semiconductor substrate 210.

According to one embodiment of the invention, a floating first type doped region may be optionally disposed beneath the isolation region 225 or in the P-type doped semiconductor substrate 210, and the surface field may be reduced by using a two or three dimensional RESURF structure.

Figure 5A:
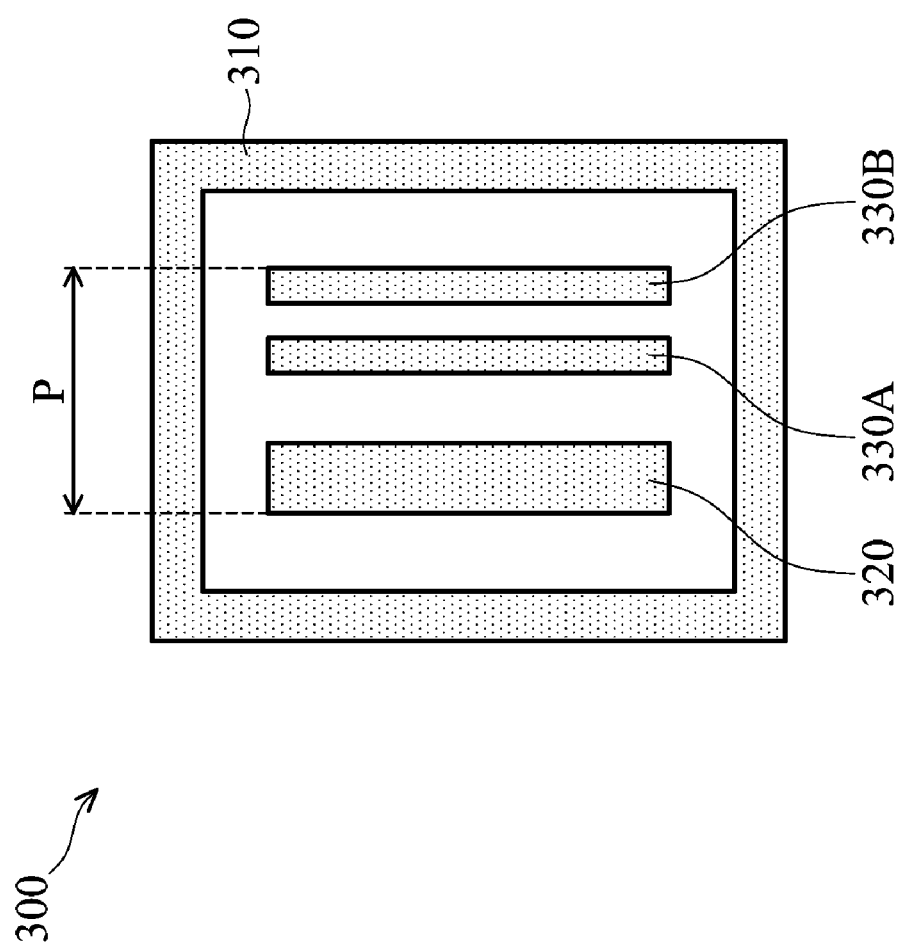
FIG. 5A shows the top view of a prior art LDMOS-FET device.

FIG. 5A shows the top view of a prior art LDMOS-FET device, and FIGS. 5B and 5C show the top view of an LDMOS-FET device of one embodiment of the invention. As FIG. 5A shows, in accordance with a high voltage (100 V) application field, the range of the prior art LDMOS-FET device 300 is defined by a P-type heavily doped region 310 and scale P composed of the drain 320 and the sources 330A, 330B is at least 40 μm. As FIG. 5B shows, according to one embodiment of the invention, the range of LDMOS-FET device 400 is defined by a P-type heavily doped region 410A. The P-type heavily doped sources 430A and 430B are ring regions encompassing the heavily doped drain region 420, respectively, and the scale P composed of the drain 420 and the sources 430A, 430B may be effectively reduced to less than 40 μm. As FIG. 5C shows, according to other embodiments of the invention, the range of LDMOS-FET device 400B is defined by a P-type heavily doped region 410B. The length of P-type heavily doped source regions 430A and 430B is the same as the length of the heavily doped drain region 420 and scale P composed of the drain 420 and the sources 430A, 430B may be effectively reduced to less than 40 μm.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high power semiconductor device, comprising:
   a first type doped semiconductor substrate;
   a second type doped epitaxial layer deposited on the first type doped semiconductor substrate;
   a first type doped body region disposed in the second type doped epitaxial layer;
   a heavily doped drain region formed in the second type doped epitaxial layer and isolated from the first type doped body region with an isolation region and a channel;
   a second type deep heavily doped region extending from the heavily doped drain region to the first type doped semiconductor substrate;
   a pair of inversed type heavily doped source regions disposed in the first type doped body region, wherein the pair of inversed type heavily doped source regions comprises a first type heavily doped source and a second type heavily doped source, and the first type heavily doped source is a ring region encompassing the heavily doped drain region; and
   a gate electrode disposed overlying the channel with a dielectric interposed therebetween,
   wherein the high power semiconductor device is isolated from the other devices with a first type heavily doped region.

2. The high power semiconductor device as claimed in claim 1, further comprising a second type heavily doped buried region disposed between the first type doped semiconductor substrate and the second type doped epitaxial layer.

3. The high power semiconductor device as claimed in claim 1, further comprising a first floating first type doped region disposed beneath the isolation region and at the channel region and the heavily doped drain region.

4. The high power semiconductor device as claimed in claim 3, wherein the first floating first type doped region is used for obstructing surface transverse current, and two dimensionally reducing the surface field.

5. The high power semiconductor device as claimed in claim 1, further comprising a second floating first type doped region disposed in the first type doped semiconductor substrate and beneath the heavily doped drain region.

6. The high power semiconductor device as claimed in claim 5, wherein the second floating first type doped region is used for three dimensionally reducing the surface field.

7. The high power semiconductor device as claimed in claim 1, further comprising a first type deep heavily doped region extending from the first type heavily doped source to the first type doped semiconductor substrate.

* * * * *